United States Patent [19]
Larsson

[11] Patent Number: 6,163,184
[45] Date of Patent: Dec. 19, 2000

[54] PHASE LOCKED LOOP (PLL) CIRCUIT

[75] Inventor: Patrik Larsson, Matawan, N.J.

[73] Assignee: Lucent Technologies, Inc., Murray Hill, N.J.

[21] Appl. No.: 09/208,524

[22] Filed: Dec. 9, 1998

[51] Int. Cl.[7] .................................................. H03L 7/06
[52] U.S. Cl. ........................ 327/156; 327/147; 327/157
[58] Field of Search .................................. 327/147, 148, 327/156, 157; 331/15, 16, 17, 25

[56] References Cited

U.S. PATENT DOCUMENTS

| | | | |
|---|---|---|---|
| 5,367,269 | 11/1994 | Yanagidaira et al. | 331/14 |
| 5,420,545 | 5/1995 | Davis et al. | 331/17 |

*Primary Examiner*—Tuan T. Lam
*Assistant Examiner*—Linh Nguyen
*Attorney, Agent, or Firm*—Henry I. Schanzer

[57] ABSTRACT

A phase locked loop (PLL) includes a programmable frequency multiplier section and a programmable divide-by-N network connected in a feedback loop between an output and an input of the frequency multiplier. The frequency multiplier section includes programmable circuitry which is programmed to vary as a function of N to render the bandwidth of the PLL independent of the divider ratio "N". The frequency multiplier includes a charge pump circuit, a filter circuit and a voltage controlled oscillator (VCO) circuit with the programmable circuitry being formed in one of these circuits to render the bandwidth of the PLL independent of the divider ratio, whereby the bandwidth is increased and the jitter at the PLL output is decreased.

49 Claims, 9 Drawing Sheets

PHASE LOCKED LOOP (PLL) CIRCUIT

BACKGROUND OF THE INVENTION

This invention relates to phase locked loop (PLL) circuits and, in particular, to PLL circuits exhibiting little jitter and enhanced bandwidths.

A problem resolved by the invention may be better explained by reference to FIGS. 1 and 2, which show a known prior art PLL circuit. FIG. 1 is a block diagram of a prior art PLL circuit which includes a crystal oscillator 11 for generating a low noise reference frequency clock signal ($fre_f$). The $fre_f$ is supplied to one input of a phase detector 15 having a second input to which is supplied an output ($f_o/N$) of a divide-by-N circuit 16. The output of the phase detector 15 supplies an up-count or a down-count signal to a charge pump circuit 17. Charge pump circuit 17 then supplies a current output to a filter network 19 whose output (in the form of a control voltage) is supplied to an input of a voltage controlled oscillator (VCO) 21, which produces an output clock signal, $f_o$, having a frequency which is equal to $(N)(f_{ref})$. The $f_o$ signal is supplied to divide-by-N network 16 to produce a feedback signal equal to $f_o/N$ which is supplied to the phase detector 15.

Noise ($n_{ref}$) associated with the reference frequency ($f_{ref}$) is injected into the front end of the system and is represented in FIG. 1 by block 13 which is part of the input to the phase detector 15. There is also noise ($n_{vco}$) associated with VCO 21 which is injected into the output of the PLL system. The noise injected into the system by VCO 21 is illustrated in FIG. 1 as an $n_{vco}$ input in block 23. Typically, $n_{vco}$ is much greater than $n_{ref}$ and is the leading cause of jitter at the PLL output. It is an object of the invention to reduce the noise and jitter present at the PLL output.

When the VCO noise dominates, it is known that the output noise associated with the VCO (and hence, $f_o$) can be reduced by increasing the bandwidth of the PLL (also referred to hereinafter as the PLL bandwidth or ($\omega_{BW}$)). For stability reasons, there is an upper limit placed on $\omega_{BW}$. A common rule of thumb is to select the PLL bandwidth such that $\omega_{BW}/f_{ref} < 2\pi/10$.

However, there is a problem in trying to increase the bandwidth which is better explained with reference to the semi-schematic, semi-block diagram of FIG. 2. The charge pump circuit 17 includes a reference current source $I_{ref}$ which is mirrored via a mirror amplifier (comprising transistors Tr, T1 and P1) to produce a pull up current, Ipu (via a mirror transistor P3), or a pull down current, Ipd (via mirroring transistors P2, T2 and T3). The bandwidth ($\omega_{BW}$) for a PLL having a charge pump circuit 17 of the type shown in FIG. 2 may be expressed as follows:

$$\omega_{BW} = [(Kvco)(Ip)R]/N \quad \text{eq. 1}$$

Where:
a) Kvco is the control voltage ($V_{CTL}$) to output frequency ($f_o$) transfer constant of the VCO (e.g., $Kvco = f_o/V_{CTL}$ of VCO21 as shown in FIG. 2);
b) Ip is the charge pump current produced at the output of charge pump 17 which flows into or out of the filter network 19;
c) N is the division ratio of the feedback divider network 16; and
d) R is the resistance of filter network 19.

The filter network also includes an integrating capacitor C. However, C is generally neglected in the discussion to follow.

As is evident from eq. 1, the bandwidth ($\omega_{BW}$) of the PLL is a function of "N" and, since it is inversely proportional to N, $\omega_{BW}$ decreases as N increases. However, N is normally set by the user after the PLL has been designed. Thus, for all but the smallest values of N, the PLL will be operating in a suboptimal condition producing an output noise which is larger than necessary. That is, the greater N is made, the lower $\omega_{BW}$ is going to be; and, as a result of $\omega_{BW}$ being decreased, more of the output noise ($n_{vco}$) will pass to the output of the PLL.

However, in many applications, the division ratio "N" can not be set to an optimum value because in those applications the division ratio "N" is varied during the operation of the system. For example, in microprocessor systems, power reduction is often achieved by reducing the divider ratio N which causes a corresponding reduction in the clock frequency supplied to the system. In other applications, such as a wireless communication system, the divider ratio N is changed during run-time. That is, a user may switch between different frequency bands or different channels by changing the value of "N" during run-time. In still other applications such as a standard cell PLL, the division ratio "N" may be varied by different users resulting, for many applications, in a decrease in the bandwidth with an attendant increase in the output noise and jitter of the VCO output supplied to the system.

SUMMARY OF THE INVENTION

In PLL circuits embodying the invention, where the PLL includes a divide-by-N network, the bandwidth of the PLL is made substantially independent of the division ratio N of the divide-by-N network. Generally, this is achieved in various embodiments of the invention by making Kvco, Ip or R a function of N. As a result, advantageously, PLL circuits embodying the invention exhibit less noise and less jitter than prior art PLL circuits.

More specifically, a phase locked loop (PLL) embodying the invention includes a frequency multiplier circuit having an input port and an output port, where the frequency multiplier is responsive to the application of an input signal having a frequency, fref, at its input port for producing at its output port an output signal, $f_o$, having a frequency equal to $(N)(f_{ref})$. A programmable frequency divider network is connected between the output and input ports of the frequency multiplier for feeding back a signal equal to $f_o/N$. The divider network is selectively programmable to divide by a number "N", where N is a number greater than 1. In a PLL embodying the invention the frequency multiplier circuit includes programmable circuitry, programmed to be a function of N, for selectively modifying the transfer function of the frequency multiplier as a function of the divider ratio N.

In certain embodiments of the invention the programmable circuitry of the frequency multiplier is programmed to be a function of N for rendering the bandwidth of the PLL substantially independent of the divider ratio "N" of the divider network.

In still other embodiments of the invention the programmable frequency divider network and the programmable circuitry are responsive to the same, or similar, command signals for changing the value of N of the programmable frequency divider network.

The frequency multiplier circuit of a PLL embodying the invention may include a charge pump circuit, a filter circuit and a voltage controlled oscillator with the programmable circuitry of the frequency multiplier being contained in one of the charge pump, filter and voltage controlled oscillator circuits.

The frequency multiplier circuit of a PLL embodying the invention may include a phase detector responsive to $f_{ref}$ and to the signal $f_o/N$ for producing an up/down control signal applied to a charge pump circuit. The charge pump circuit produces a sourcing (charging) or a sinking (discharging) current which is supplied to a capacitive filter network for developing a control voltage proportional to the sourcing/sinking current.

The control voltage is applied to a voltage controlled oscillator (VCO) for producing an output signal having a frequency $f_o$ equal to (N)(fref) which is supplied to the divider network which is programmed to have a selected divider ratio "N", for generating the $f_o/N$ signal applied to the phase detector. In a PLL embodying the invention at least one of the charge pump circuit, the filter network and the voltage controlled oscillator is made a function of the divider ratio N for enabling the PLL to have a greater bandwidth, and for reducing the jitter at its output.

In one PLL circuit embodying the invention, the current (Ip) produced at the output of the charge pump circuit is made a function of the divider ratio "N"; [i.e., Ip is made equal to $(N)(I_{ref})$, where N is the divider ratio and $I_{ref}$ is a reference current]. The bandwidth ($\omega_{BW}$) of the PLL may then be expressed as:

$$\omega_{BW}=(K_{vco})(I_{ref})(R);$$

where $(N)(I_{ref})=I_p$, and R represents the resistance of the filter network.

In another PLL circuit embodying the invention, the control voltage to frequency transfer constant ($K_{vco}$) of the VCO is made a function of the divider ration "N"; [i.e., $K_{vco}$ is programmed to equal (N)(Ku), where Ku is a selected unit value of the transfer constant]. The bandwidth ($\omega_{BW}$) of the PLL may then be expressed as:

$$\omega_{BW}=(Ku)(Ip)(R); \text{ where } Ku=(N)(K_{vco})$$

In still another PLL circuit embodying the invention, the PLL is made a function of $f_{ref}$ and the current (Ip) produced at the output of the charge pump circuit is made equal to $(X)(I_{vco})/N$; where X is a proportionality constant, and $I_{vco}$ is a current produced in response to a control voltage which is also applied to the VCO of the PLL circuit. The bandwidth ($\omega_{BW}$) of the PLL may then be expressed as:

$$\omega_{BW} \, (Kvco)(R)(X)(f_{ref})^2/b^2; \text{ where } I_p=(X)(I_{vco}/N)$$

In yet still another PLL circuit embodying the invention, the filter network is made a function of "N"; [i.e., the filter includes a resistor R which is programmed to equal Ru/N, where Ru is a selected unit value of resistance]. The bandwidth ($\omega_{BW}$) of the PLL for this embodiment may be expressed as:

$$\omega_{BW}=(Kvco)(Ip)(Ru); \text{ where } R=Ru/N \text{ or } Ru=NR$$

Thus, PLL circuits formed in accordance with the invention have a different bandwidth equation than prior art PLL circuits. That is, the basic bandwidth ($\omega_{BW}$) of a PLL, which may be generally expressed by equation 1, above, is modified in accordance with the invention such that the effect of the divider ratio "N" is substantially eliminated from the bandwidth equation.

BRIEF DESCRIPTION OF THE DRAWINGS

In the accompanying drawing like reference characters denote like components, and.

DETAILED DESCRIPTION OF THE INVENTION

In PLL circuits embodying the invention the bandwidth ($\omega_{BW}$) of the PLL is made independent of the divider ratio N, whereby the PLL will always run at its maximum allowed bandwidth which minimizes jitter at the PLL output. As detailed below, the PLL includes a frequency multiplier section which includes a charge pump circuit, a filter circuit and a voltage controlled oscillator circuit. In accordance with the invention, any one of these three circuits may be modified to be a function of "N" to render the bandwidth of the PLL substantially independent of the divider ratio "N".

Figure 1:
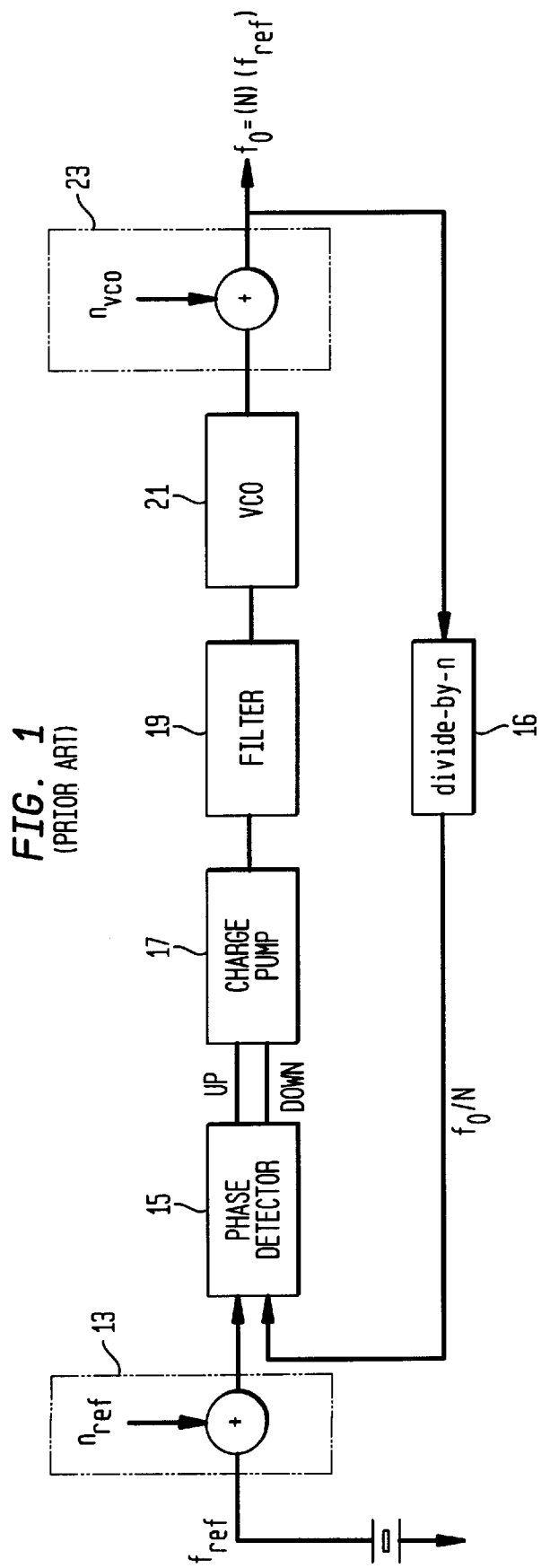
FIG. 1 is a block diagram of a prior art PLL circuit.
Figure 2:
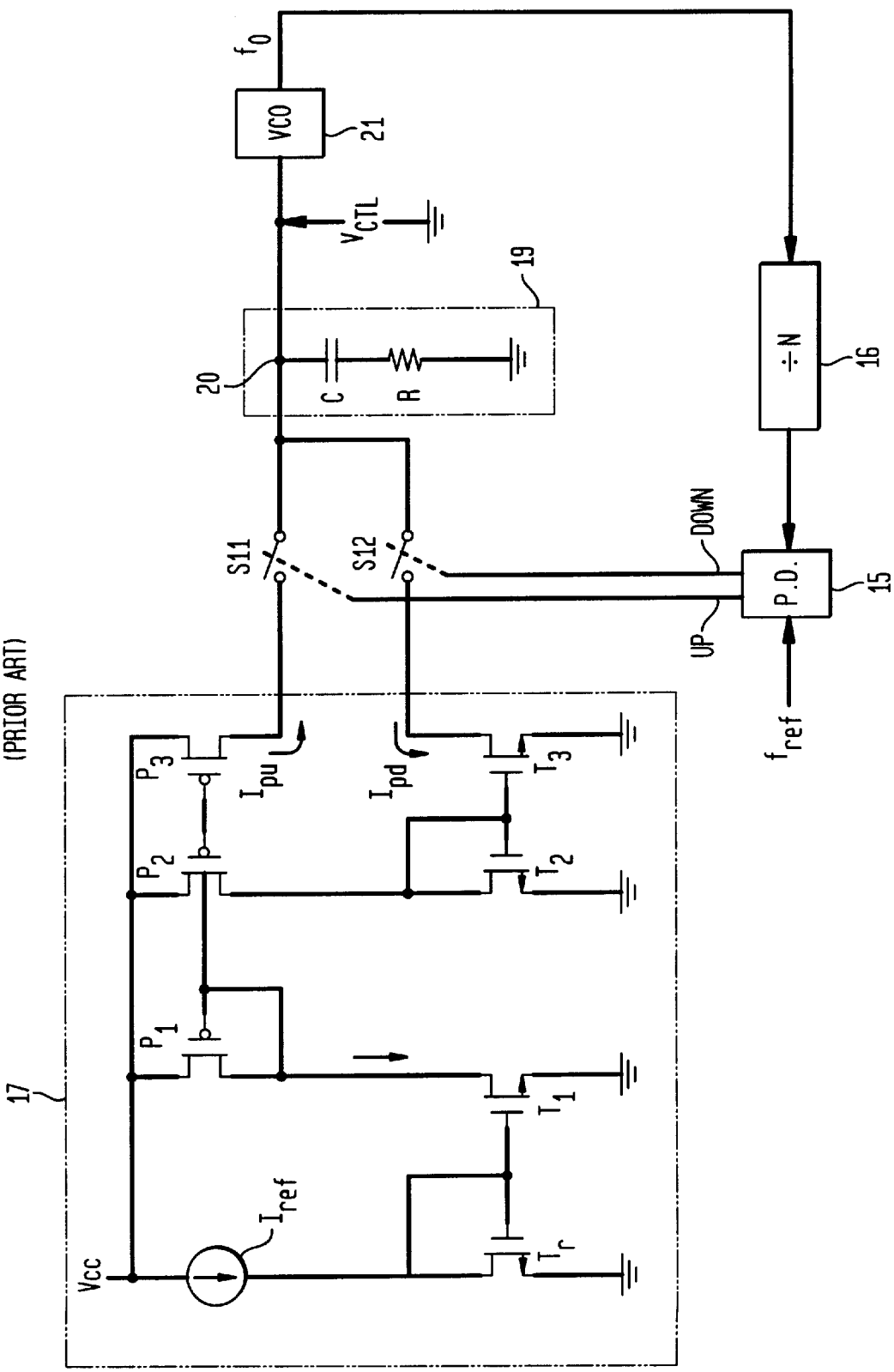
FIG. 2 is a partial block and partial schematic diagram illustrating an implementation of the prior art diagram of FIG. 1.
Figure 3:
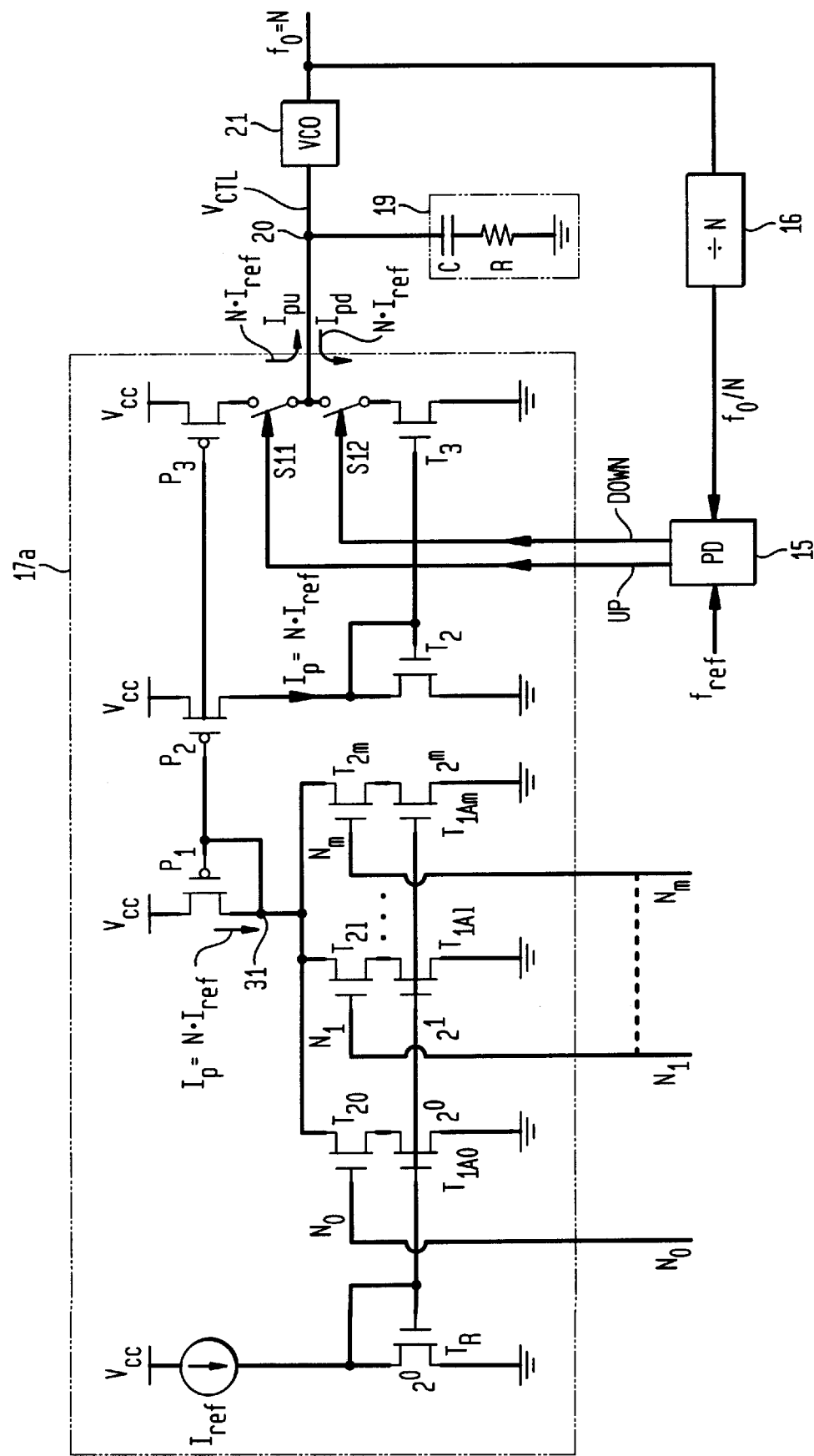
FIG. 3 is a partial schematic, partial block, diagram of a PLL circuit embodying the invention incorporating an amplifying current mirror circuit in the charge pump circuit.

In accordance with the invention, the bandwidth $\omega_{BW}$ of a PLL can be made substantially independent of the division ratio N as shown in FIG. 3. The charge pump circuit 17a of FIG. 3 is different than the prior art charge pump circuit 17 shown in FIGS. 1 and 2. The charge pump circuit 17a of FIG. 3 includes current mirror multiplication, in accordance with the invention, to make the bandwidth $\omega_{BW}$ of the PLL independent of N.

In the circuit of FIG. 3, the charging/discharging charge pump current, Ipu or Ipd (Ip), supplied to the filter capacitor network 19 is made (substantially) equal to $(N)(I_{ref})$; where "N" is equal to the divider ratio "N" of divider network 16. Ip is made equal to $(N)(I_{ref})$ based on the recognition that the number N may be expressed as a binary number such that:

$$N=(N_m 2^m + \ldots + N_1 2^1 + N_0 2^0);$$

with each $N_i$ being a binary bit with a value of 1 or 0.

Referring to FIG. 3, note that a reference current $I_{ref}$ flows through a reference transistor $T_r$. A number m of current mirror amplifying transistors ($T_{1A0}$–$T_{1Am}$) have their gate-to-source paths connected in parallel with the gate-to-source path of $T_r$. For purpose of illustration, the sizing of the current mirror amplifying transistors $T_{1A0}$–$T_{1Am}$ is such that $T_{1A0}$ is the same size as $T_r$, $T_{1A1}$ is twice ($2^1$) the size of $T_r$, $T_{1A2}$ is four times ($2^2$) the size of $T_r$ and $T_{1Am}$ is $2^m$ times the size of $T_r$.

In certain of the figures, reference is made to transistors and, in particular, to complementary metal oxide semiconductor (CMOS) devices. Transistors of P-conductivity are identified with a reference character beginning with the letter P, while transistors of N-conductivity type are identified with a reference character beginning with the letter T.

In the charge pump circuit 17a of FIG. 3, each one of the current mirror amplifier transistors $T_{1A0}$–$T_{1Am}$ is selectively switched into the circuit via a corresponding switching transistor, $T_{20}$–$T_{2m}$, to a current summing node 31. These switching transistors, $T_{20}$–$T_{2m}$, enable a selected number (1 through m) of units of $I_{ref}$ to be summed at node 31, whereby a number N of units of $I_{ref}$ are summed at node 31. Therefore, there is produced a current $I_p$=(N)($I_{ref}$) flowing through a transistor $P_1$.

The current Ip flowing through transistor $P_1$ is mirrored in transistor $P_2$, whereby a current Ip equal to (N)($I_{ref}$) flows through transistors $P_2$ and $T_2$. The "sourcing" current flowing through $P_2$ is mirrored via transistor $P_3$ whereby a "source" current $I_p$ which is equal to N times $I_{ref}$, (also designated as $I_{pu}$ for "pull-up" current) can flow through P3 to charge up capacitor C of the RC filter network 19. Likewise, the "sinking" current flowing through T2 is mirrored via transistor T3 whereby a "sink" current Ip which is equal to N times $I_{ref}$ (also designated as $I_{pd}$ for pull-down) can flow through T3 to discharge capacitor C, of the RC filter network 19, to ground.

In the circuit of FIG. 3, the "sourcing" current flowing through P3 and into capacitor C is equal to (N)($I_{ref}$). It is this current which charges up the capacitor C and raises the "control" voltage ($V_{CTL}$) developed at node 20 (which is applied to VCO 21). Similarly, the discharging (sinking) current flowing through T3 and drawn out of capacitor C is also equal to (N)($I_{ref}$). It is this current which lowers the control voltage developed at node 20 which is applied to VCO 21. Making the value of the output current of the charge pump circuit 17a a function of the divider ratio "N" is in sharp contrast to the structure and operation of the charge pump circuit 17 of FIG. 2.

In the circuit of FIG. 2, the value of the output current (Ip) of the charge pump circuit 17 is preset and fixed. That is, the reference current $I_{ref}$ flowing in $T_r$ is multiplied by some fixed constant K to make $KI_{ref}$ equal to Ip, where K is equal to some design constant.

Figure 3A:
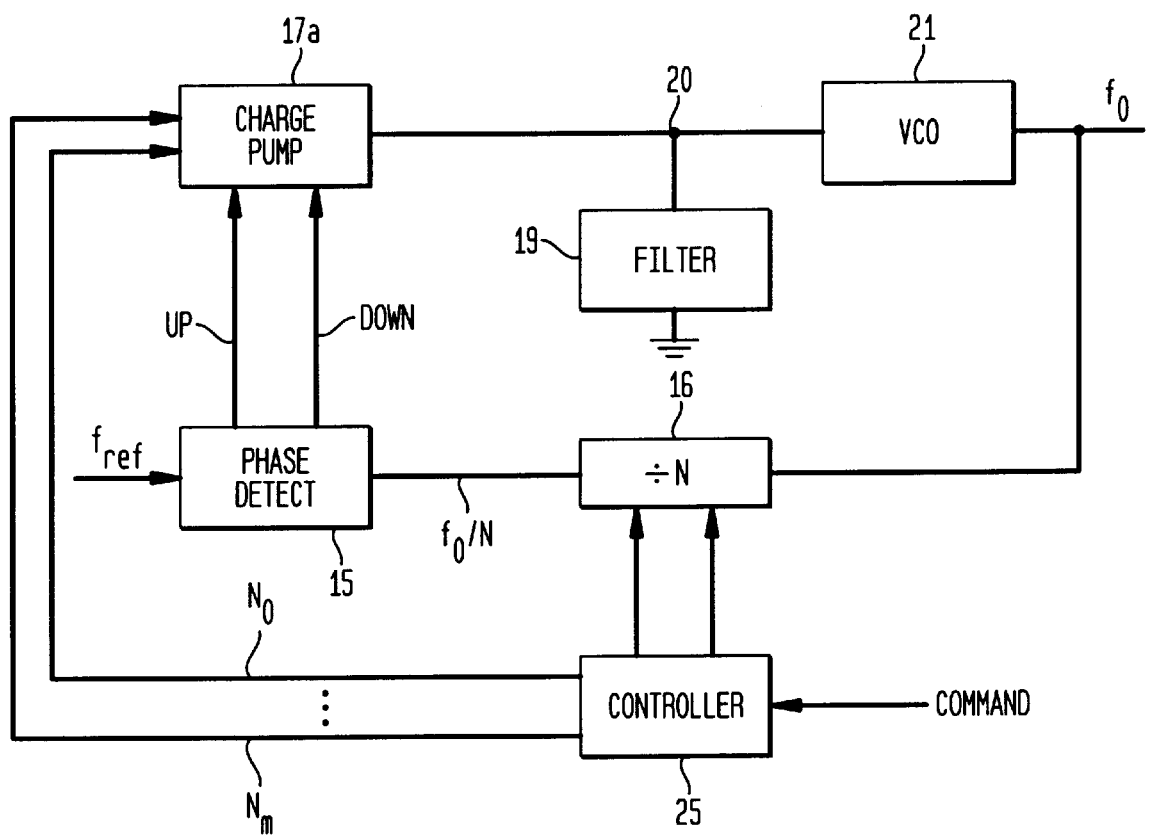
FIGS. 3A and 3B are block diagrams illustrating alternate arrangements for setting a divider network ratio and a charge pump circuit multiplier ratio in accordance with the invention.
Figure 3B:
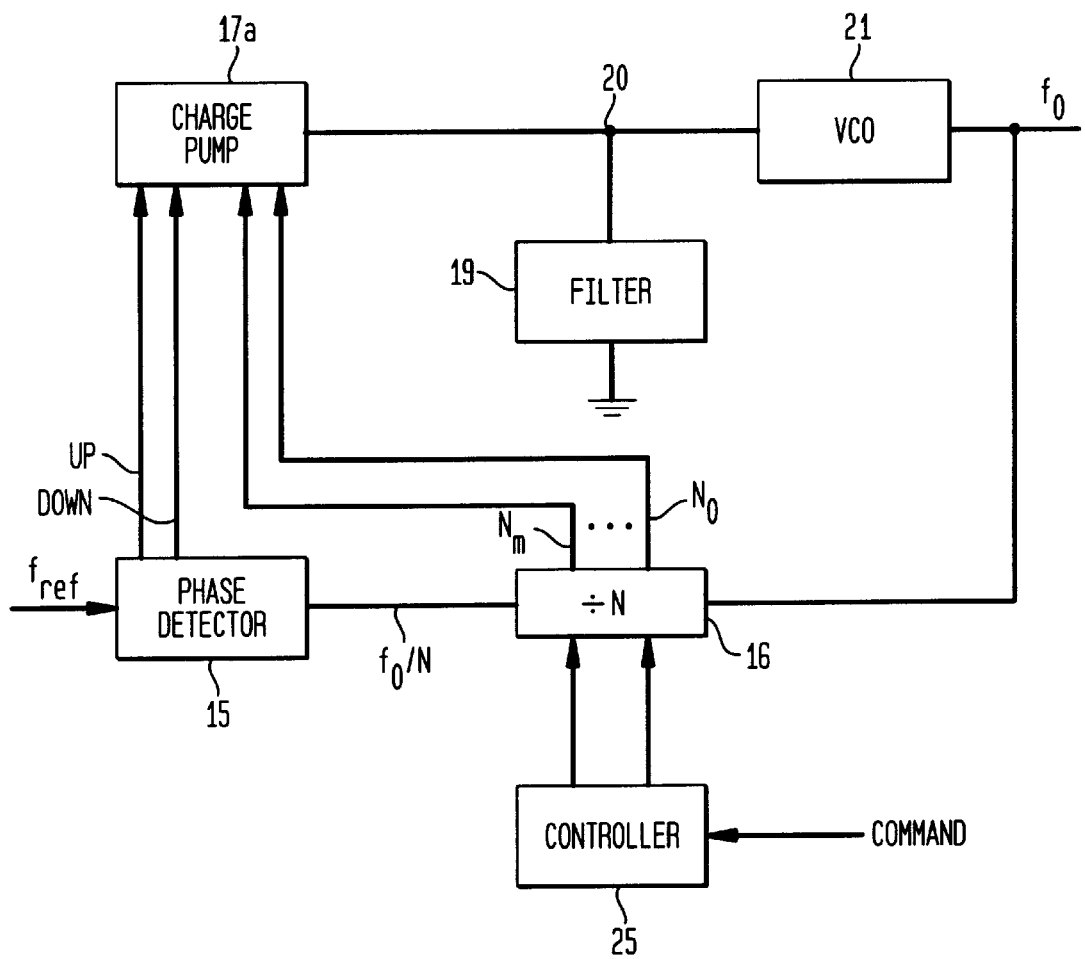

In contrast to the prior art, in the circuit of FIG. 3, the output current Ip of the charge pump circuit 17a is made a function of the divider ratio (N) of the divider network 16 such that Ip=(N)($I_{ref}$); where N varies as the divider ratio varies. Thus, as N changes, so does the amplitude of the output current of the charge pump circuit. As shown in block form in FIG. 3A, a control circuit 25, under the control of one or more command signals, may be used to supply control signals to the divider network 16 to control and set the ratio "N" of divider network 16. The control circuit 25 concurrently supplies control signals (i.e., $N_o$ through $N_m$) to control and set the current multiplying ratio in charge pump circuit 17a. Alternatively, as shown in FIG. 3B, the control circuit 25, under the control of one or more command signals, may be used to supply control signals to the divider network 16 which then generates control signals ($N_o$ through $N_m$) supplied to charge pump circuit 17a for controlling and setting its current multiplying ratio.

The operation of the circuit of FIG. 3 is such that depending on the condition of $f_{ref}$ and $f_o$/N the output of phase detector 15 generates an UP signal or a DOWN signal. That is, the output frequency of the programmable divide-by-"N" counter locks onto and tracks the phase of the reference frequency. A phase difference between the divide-by-"N" counter output and the reference frequency produces a correction voltage at the output of the phase comparator 15. The polarity of this correction voltage is such that it will pull the voltage-controlled oscillator (VCO) frequency in such a direction that the divide-by-"N" output frequency will phase-track the reference frequency. When an UP signal is generated switch S11 (See FIG. 3) is closed (i.e., turned-on) and a sourcing current equal to (N)($I_{ref}$) flows into the filter (RC) network 19 causing the control voltage at node 20 to rise. When a DOWN signal is generated switch S12 (See FIG. 3) is closed (i.e, turned-on) and a sinking current equal to (N)($I_{ref}$) flows out of the the filter (RC) network 19 causing the control voltage at node 20 to decrease.

In practice, switches S11 and S12 may be any suitable transistor(s) which are turned on and off in response to the UP/DOWN control signals produced by phase detector 15. In the operation of the circuit, only one of S11 and S12 is normally on at any one time, or S11 and S12 may both be off during a period of time; normally, S11 and S12 are not both on at the same time.

By making the output current of the charge pump circuit equal to N times $I_{ref}$, it may be demonstrated that the bandwidth of the PLL is rendered essentially independent of the divider ratio "N" introduced by divider network 16.

The bandwidth ($\omega_{BW}$) of the PLL of FIG. 3 may be derived by substituting (N)($I_{ref}$) for $I_p$ in eq. 1, above. The substitution yields:

$$\omega_{BW}=[(Kvco)(R)/N][(N)(I_{ref})] \qquad \text{eq. 2}$$

The constant N may be eliminated from the numerator and denominator of eq. 2, yielding:

$$\omega_{BW\_}(Kvco)(R)(I_{ref}) \qquad \text{eq. 3}$$

Therefore, as demonstrated by equation 3, the bandwidth of the PLL of FIG. 3 is substantially independent of "N". That is, for the PLL of FIG. 3, the design parameters Kvco, $I_{ref}$, and R are chosen to maximize the bandwidth of the PLL and to meet the stability constraints that [$\omega_{BW}/f_{ref}$]=[2 π/10]. As a result, the PLL of FIG. 3 may be designed such that the jitter of $f_o$ is reduced and the bandwidth is greater than in prior art PLL circuits.

Figure 4:
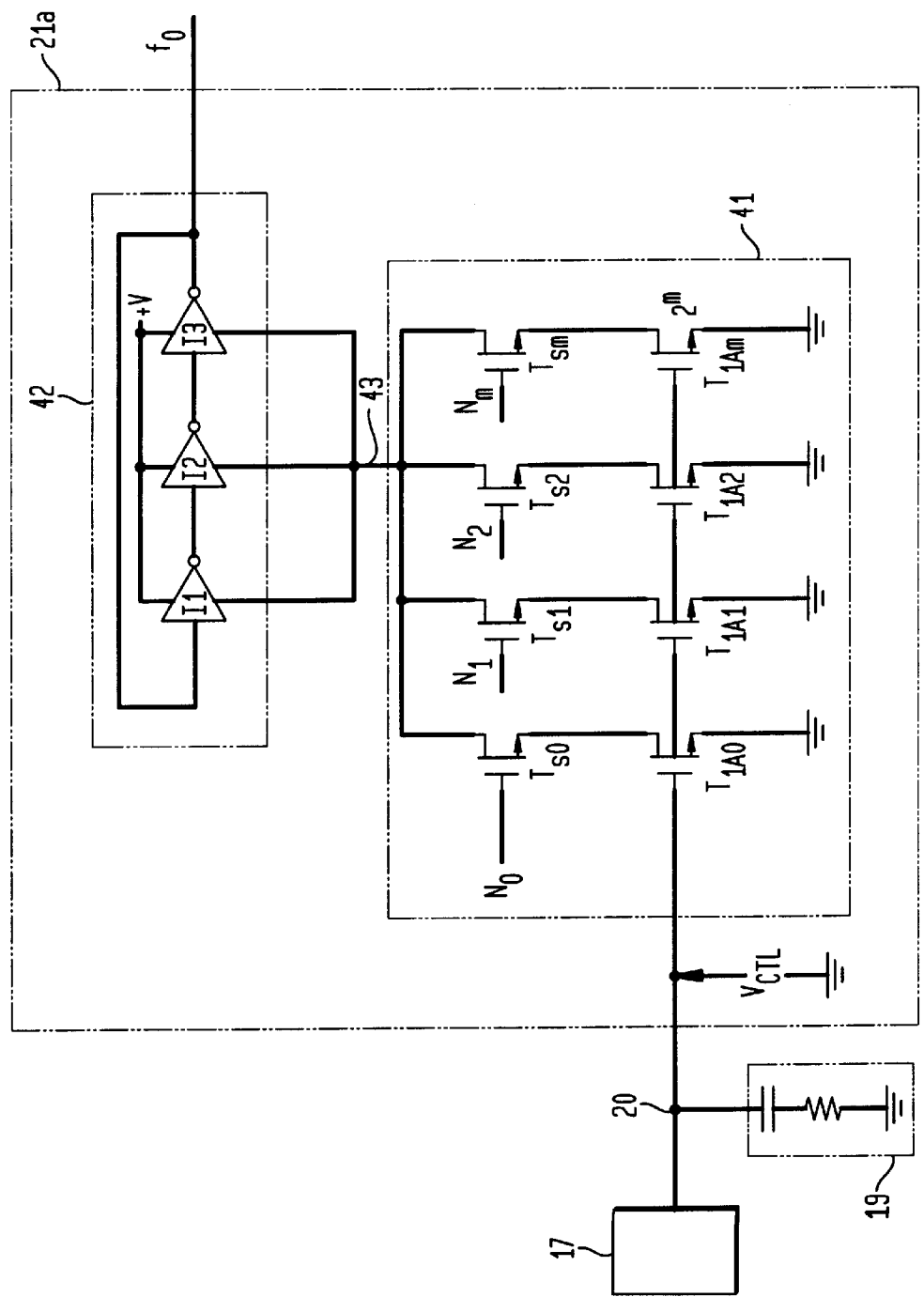
FIG. 4 is a partial schematic partial block diagram of a PLL circuit embodying the invention incorporating a network for modifying the voltage to frequency transfer constant of the VCO.

FIG. 4 illustrates a PLL in which the voltage transfer constant (Kvco) of the VCO is programmed to make $\omega_{BW}$ independent of the division ratio N. In FIG. 4, the charge pump 17 is of the same type as shown in FIG. 2, with the output of the charge pump driving the filter network 19 to develop a control voltage ($V_{CTL}$) which is applied to the VCO 21a. In FIG. 4, the VCO of the prior art is modified in accordance with the invention to include a programmable current multiplier network 41 which, in response to a control voltage ($V_{CTL}$), controls the current and voltage supplied to an oscillating network 42 (illustrated, by way of example, as three inverters connected in cascade with positive feedback being provided between the output of the third inverter and the input of the first inverter). The network 41 includes "m" paths, with each of the "m" paths for supplying a different, binary increasing, current level and each path being selectable by means of switching transistors (Tsi). In contrast to the prior art, the VCO 21a embodying the invention is programmed to be a function of the division ratio "N".

The network 41 of FIG. 4 includes "m" paths, connected in parallel between ground and a terminal 43, with each one of the m paths including a current amplifying transistor ($T_{1A\phi}$ to $T_{1Am}$) connected in series with a corresponding switching transistor ($T_{S\phi}$ to $T_{Sm}$). As in the circuit of FIG. 3, the sizing of the current mirror amplifying transistors is such that transistor $T_{1A\phi}$ is selected to be of given size, then $T_{1A1}$ is twice the size of $T_{1A\phi}$, $T_{1A2}$ is four times the size of $T_{1A\phi}$, and so on, with $T_{1Am}$ being $2^m$ times the size of $T_{1A\phi}$. In FIG. 4, the gate-to-source paths of the current mirror amplifying transistors are connected in parallel between terminal 20 and ground with the control voltage ($V_{CTL}$) being applied to terminal 20. The turn-on of switching transistors $T_{S\phi}$ to $T_{Sm}$ may be controlled by a controller of similar type to controller 25 as shown in FIG. 3A or to signals derived from divider network 16 as shown in FIG. 3B. Thus, in FIG. 4, as the divider ratio "N" changes, so does the control voltage to frequency transfer constant ($K_{vco}$). Thus, as N increases, the network 41 causes more current to flow in the VCO section 42 resulting in a higher frequency being produced. This is advantageous in some applications. In FIG. 4, the VCO section 42 is represented by three inverters connected in cascade. It should be appreciated that the inverters may be designed to provide any desired signal characteristics (e.g., symmetrical output and amplitude).

In accordance with the invention, in the circuit of FIG. 4, Kvco, which is equal to $f_o/V_{CTL}$, is made equal to (N)(Ku); where N is equal to the division ratio of network 16 and Ku is a unit (or reference) value assigned to the voltage to frequency transfer constant of the VCO 21a. Substituting the value of (N)(Ku) for Kvco in eq. 1, above, yields the following:

$$\omega_{BW} = (Kvco)(Ip)(R/N) = [(N)(Ku)(Ip)(R)]/N \qquad \text{eq. 4}$$

Cancelling N in the numerator and denominator of eq. 4 yields the following:

$$\omega_{BW} = (K)(Ip)(R) \qquad \text{eq. 5}$$

It is evident from equation 5 that the PLL of FIG. 4, like the PU circuit of FIG. 3, has a bandwidth ($\omega_{BW}$) which is independent of the division ratio "N". In the circuit of FIG. 4, only one network 41 is shown for the 3 inverter oscillator network. It should be appreciated that a separate network 41 could be connected to control each inverter. That is, each inverter ($I_1$, $I_2$, $I_3$) could have its own $K_{vco}$ control network 41.

Figure 5:
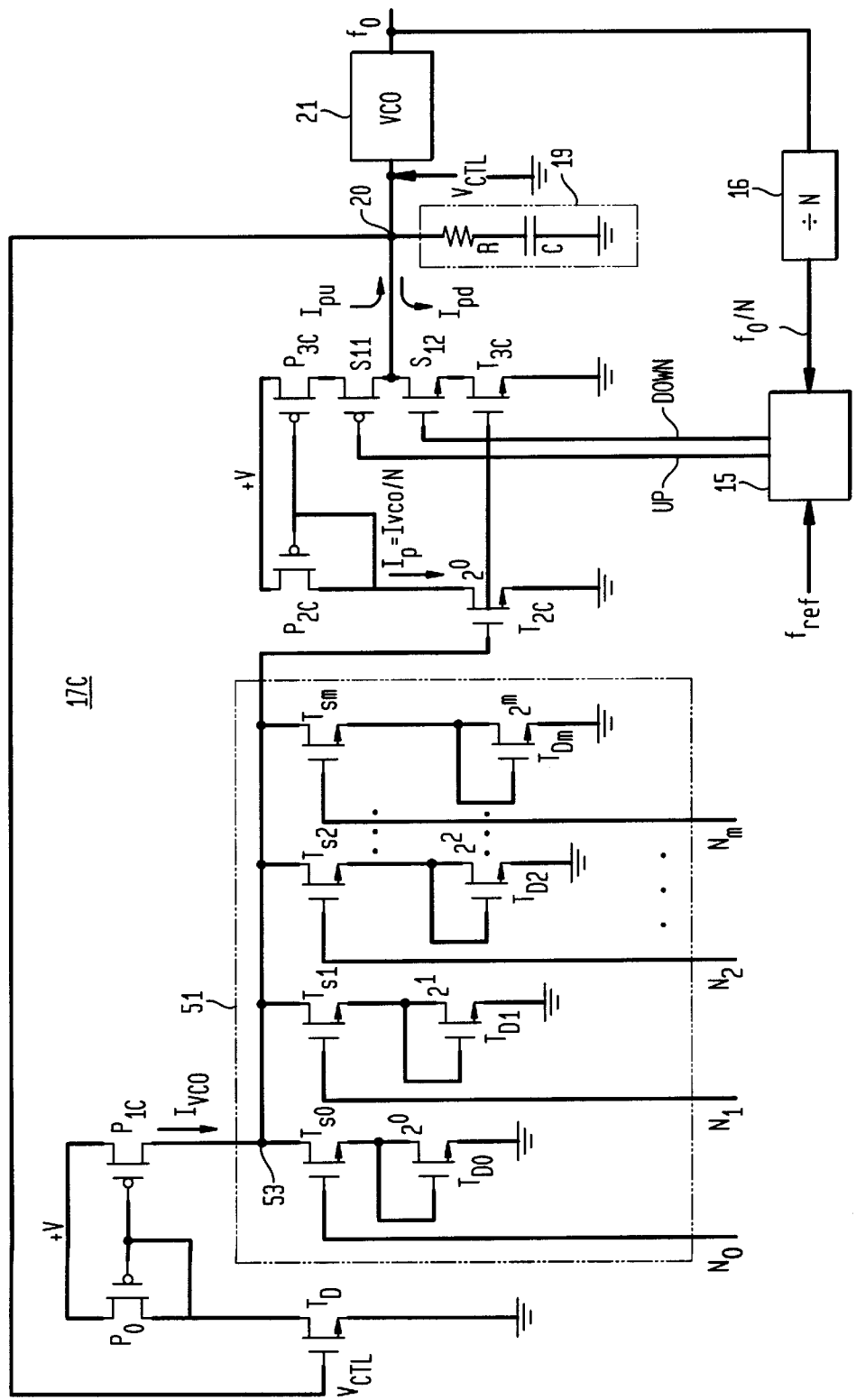
FIG. 5 is a partial schematic partial block diagram of a PLL circuit embodying the invention incorporating a current divider network in the charge pump circuit.
Figure 5A:
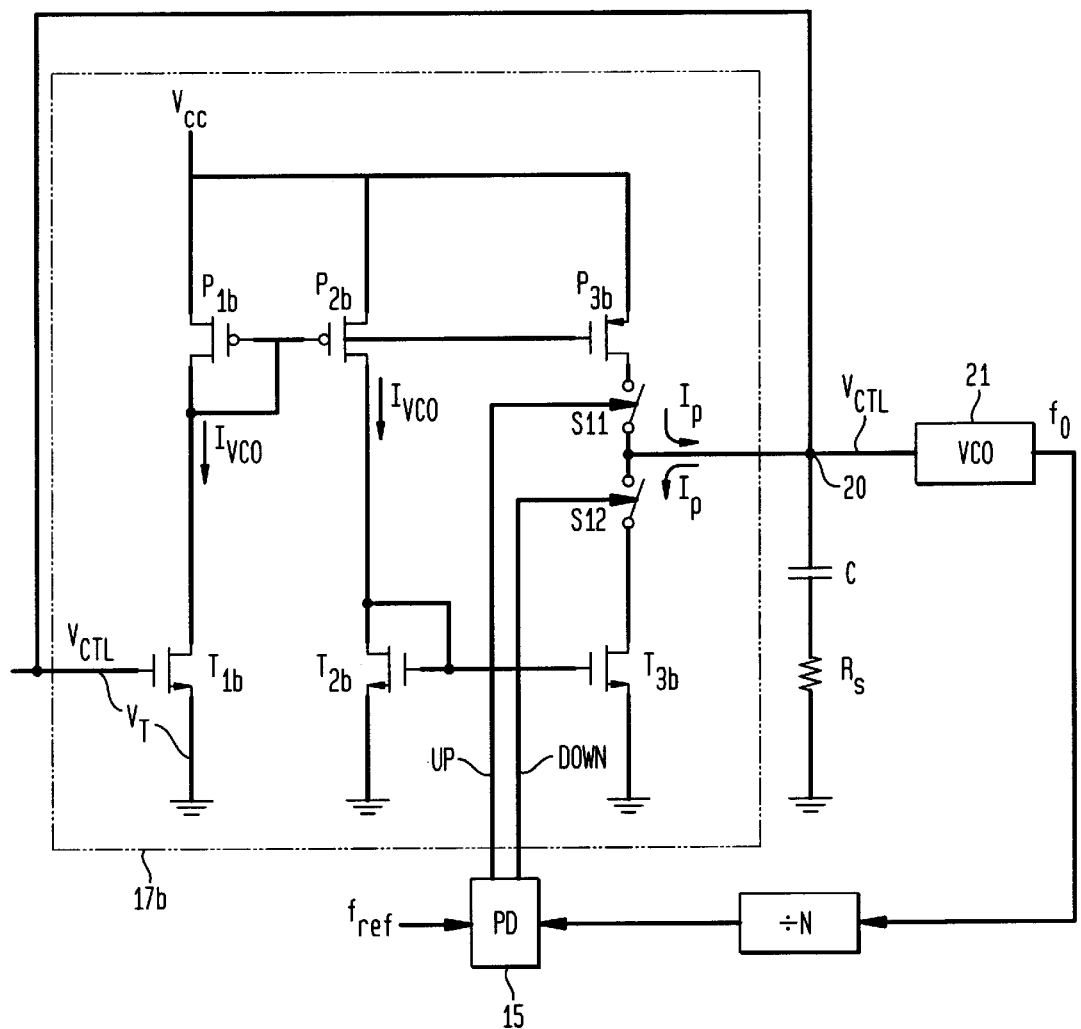
FIG. 5A is a partial block and partial schematic diagram illustrating a different implementation of the prior art diagram of FIG. 1.

In certain applications, it is desirable to make the bandwidth ($\omega_{BW}$) of the PLL synthesizer a function of the reference frequency $f_{ref}$. This may be achieved by controlling the amplitude and the output current of the charge pump circuit 17b with a control voltage $V_{CTL}$ as shown in FIG. 5A. Thus, FIG. 5A shows a known method for making $\omega_{BW}$ vary as a function of $f_{ref}$. For the PLL of FIG. 5A, the value of $f_o$ in terms of the PLL parameters may be expressed as follows:

$$f_0 = Kvco(V_{CTL} - Vt) = b\sqrt{Ivco} = (N)(f_{ref}) \qquad \text{eq. A}$$

where, referring to FIG. 5A:
a) $V_{CTL}$ is the control voltage ($V_{CTL}$) applied to the VCO 21 and fed back to the base of a charge pump transistor $T_{1b}$;
b) Vt is the threshold voltage of transistor $T_{1b}$, which, by way of example, is an N-type MOS transistor;
c) Ivco is the drain current in $T_{1b}$ which flows in response to $V_{CTL}$; and
d) "b" is a current ($I_{vco}$) to frequency ($f_o$) transfer constant (i.e., $b^2 = f_o^2/I_{vco}$).

In the prior art circuit of FIG. 5A, the current, Ip, supplied by the charge pump to the filter circuit (RC) is made proportional to $I_{vco}$, such that $I_p = (X)(I_{vco})$. The factor X is a fixed constant which may, for example, be set by controlling the sizing of transistors $P_{3b}$ to $P_{2b}$ and $T_{3b}$ to $T_{2b}$.

The bandwidth ($\omega_{BW}$) for the circuit of FIG. 5A may be expressed as follows by substituting $(X)(I_{vco})$ for $I_p$ in eq. 1 above:

$$\omega_{BW}[K_{vco}](Ip)(R)]/N = [(Kvco)(X)(Ivco)(R)]/N \qquad \text{eq. B}$$

Since $$\sqrt{I_{vco}} = \frac{N \cdot f_{ref}}{b}. \qquad \text{eq. C}$$

Equation B may be rewritten as:

$$\omega_{BW} = [(Kvco)(X)/N](N^2)[(fref)^2/b^2](R) = (Kvco)(X)(N) \\ (f_{ref}/b)^2(R) \qquad \text{eq. D}$$

Thus, the bandwidth of the prior art circuit of FIG. 5A is a function of $f_{ref}$. However, $\omega_{BW}$ is also a function of N, which is undesirable for the reasons discussed above. In accordance with an aspect of the invention, the circuit of FIG. 5A may be modified as shown in FIG. 5, to eliminate the dependence of the $\omega_{BW}$ on the divider ratio "N". This is accomplished in FIG. 5 by making the charge pump output current ($I_p$) a function of N such that $I_p = (X)(I_{vco})/N$.

In FIG. 5, a current divider network 51 is connected between a node 53 and ground. The network 51 of FIG. 5 includes "m" paths connected in parallel between node 53 and ground, with each one of the m paths including a current mirror dividing transistor ($T_{D\phi}$ to $T_{Dm}$) connected in series with a corresponding switching transistor ($T_{S\phi}$ to $T_{Sm}$). As in the circuits of FIGS. 3 and 4, the sizing of the current dividing transistors is such that transistor $T_{D\phi}$ is selected to be of given size; then, $T_{D1}$ is twice the size of $T_{D\phi}$, $T_{D2}$ is four times the size of $T_{D\phi}$, and so on with $T_{Dm}$ being $2^m$ times the size of $T_{D\phi}$. In FIG. 4, the gate-to-source and drain-to-source paths of the current dividing transistors are selectively switched to provide parallel paths between node 53 and ground. The turn-on of switching transistors $T_{S\phi}$ to $T_{Sm}$ may be controlled by a controller of similar type to controller 25 shown in FIG. 3A or to signals derived from divider network 16 as shown in FIG. 3B.

In FIG. 5, the gate-to-source path of a transistor $T_{2C}$ is connected between node 53 and ground and, where transistor $T_{2C}$ is sized to be of the same size as transistor $T_{D\phi}$, the current ($I_p$) flowing in the source-drain path of $T_{2C}$ is equal to $I_{vco}/N$. The gate-to-source path of a transistor $T_{3C}$ is connected in parallel with the gate-to-source path of $T_{2C}$ to produce a sink current $I_{pd}$ out of node 20 which will have the same amplitude current as the Ip where $T_{2C}$ and $T_{3C}$ are of the same size. The current in $T_{2C}$ is mirrored via transistors $P_{2C}$ and $P_{3C}$ to produce a source current $I_{pu}$ into node 20 which is designed to be equal to $I_{pd}$ by making $P_{2C}$ and $P_{3C}$ the same size.

The current divider network 51 makes the response of the charge pump circuit 17C a function of the divider ratio N. As demonstrated below, doing this eliminates the divider ratio "N" as a factor in the bandwidth equation of the PLL of FIG. 5.

The bandwidth equation for the PLL circuit of FIG. 5 may be derived by substituting $(X)(I_{vco})/N$ for $I_p$ in equation B, above, as shown below:

$$\omega_{BW} = [(Kvco)(Ip)(R)]/N = [(Kvco)(X)(Ivco)(R)]/N^2 \qquad \text{eq. E}$$

Then, substituting the value of $$\sqrt{I_{vco}} = (N)(f_{ref})/b$$

from equation C, above, into equation E yields:

$$\omega_{BW} = (Kvco)(X)(R)(f_{ref}/b)^2 \qquad \text{eq. F}$$

An examination of the bandwidth equation F for the circuit of FIG. 5 indicates that modifying the PLL of FIG. 2A, in accordance with applicant's invention, yields a PLL bandwidth ($\omega_{BW}$) which is independent of the divider ratio N while still being a function of $f_{ref}$.

A detailed examination of the circuit of FIG. 5 confirms the operation outlined above. The current $I_{vco}$ mirrored via $P_{1c}$ and flowing into node 53 is divided into "m" paths. The left hand path can carry a unit of current ($2^0$) via TDϕ, the next path can carry 2 units of current ($2^1$) via TD1, the next one 4 units of current, and so on, until the "m"th path which can carry ($2^m$) units of current via TDm. The current paths are switched into the circuit by means of corresponding current switches Tso through Tsm. The current flowing through transistor TDϕ is equal to 1/N the $I_{vco}$ current flowing into node 53 (i.e., $I_{TD\phi}$=IVCO/N).

Assuming the impedance of the current switches, when turned-on, to be negligible, note that the gate-to-source of transistor $T_{2c}$ is then in parallel with the gate-to-source paths of all the $T_{Di}$ transistors switched into the circuit. Then, by making the size of $T_{2c}$ the same as $T_{D\phi}$, the current mirrored in the source-drain path of $T_{2c}$ is equal to $I_{vco}$/N. This current is drawn through $P_{2c}$ and the current through $P_{2c}$ and $T_{2c}$ are respectively mirrored via $P_{3c}$ and $T_{3c}$ to produce an output current Ipu=Ipd=$I_{vco}$/N.

Figure 6:
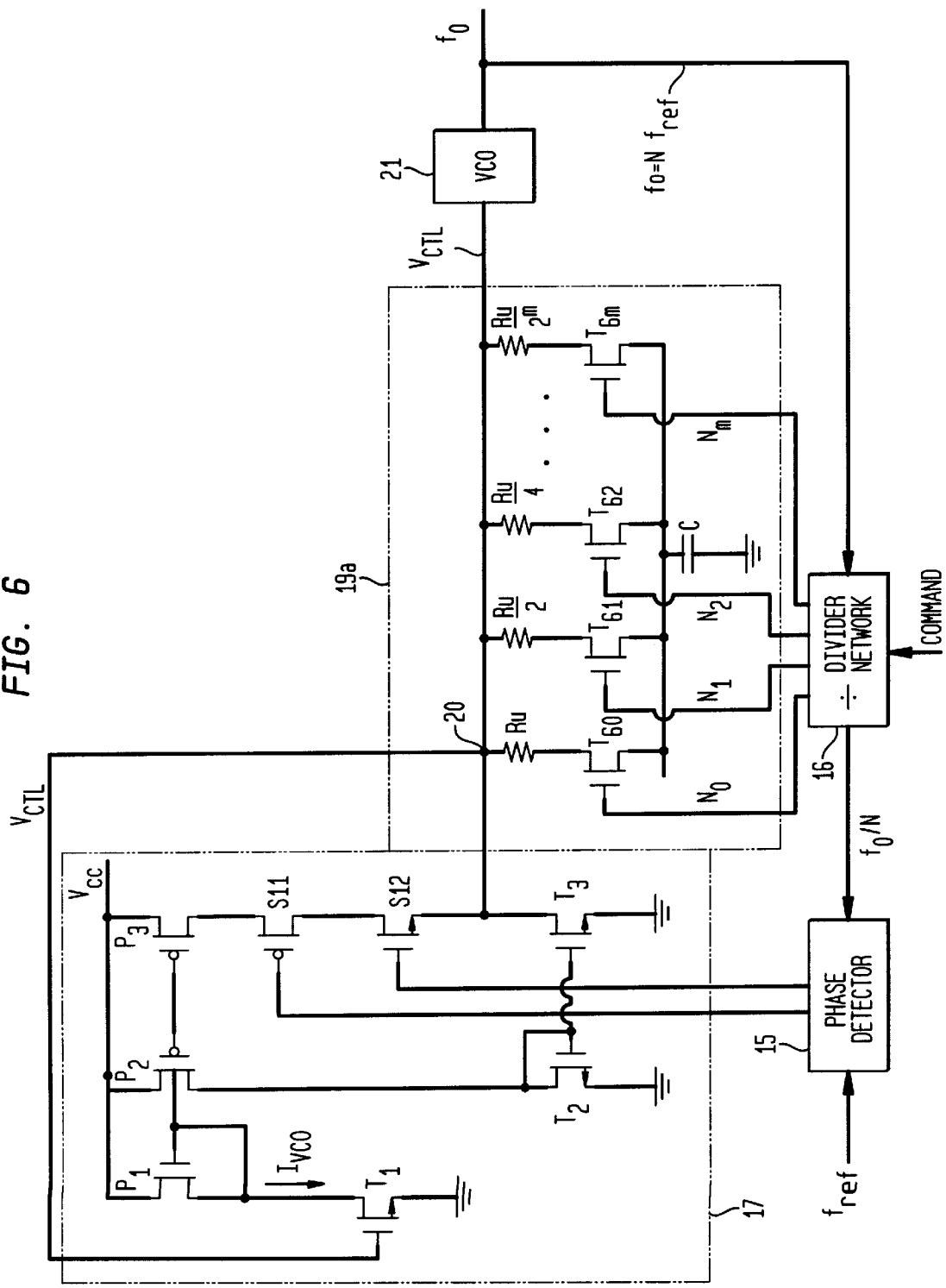
FIG. 6 is a partial schematic partial block diagram of a PLL circuit embodying the invention incorporating a resistance modifying network in the filter circuit.

In the PLL circuit of FIG. 5, the charge pump circuit 17c was modified to eliminate the dependence of $\omega_{BW}$ on the division ratio N. Applicant recognized that a similar result may be obtained by modifying the resistance of the filter resistors in filter network 19, as shown in FIG. 6. Referring to FIG. 6, note that the resistance R may be subdivided into "m" resistors ranging from the highest resistance down to the lowest value of resistance having a value equal to Ru/$2^m$. The "m" resistors can be selectively switched into the circuit via switching transistors (T6ϕ–T6m) controlled by input signals Nϕ–Nm. In FIG. 6, the command signal applied to the divider network 16 determines the ratio N. The ratio N determines the value of $f_o$/N. Also, outputs of the divider network control the value of the resistive network in the filter network.

In the circuits of FIG. 6, the total resistance R in the filter network is equal to Ru/N where Ru is a unit of resistance.
Substituting Ru/N for R in equation B, above, yields:

$$\omega_{BW} = [(Kvco)(X)(Ivco)(R)]/N;$$

$$\omega_{BW} = [(Kvco)(X)(Ivco)][Ru/N^2];$$

Replace Ivco by using equation C, above:

$$\omega_{BW} = [(Kvco)(N^2)][(f_{ref})^2(Ru)/(b^2N^2)];$$

$$\omega_{BW} = [(Kvco)(Ru)][(f_{ref})^2/(b^2)].$$

Thus, the PLL circuit of FIG. 6, modified in accordance with the invention, has a bandwidth which is not dependent on the division ratio N.

In the discussion above, it has been shown that, in accordance with the invention, the bandwidth of the PLL can be made independent of the division ration N. However, it should be understood that, due to various circuit limitations in the various components and subcomponents of the PLL, the "cancellation" of the division ratio N may not be total. But it should be clear that it is sufficient that the bandwidth of the PLL be substantially, or essentially, independent of the division ratio "N".

It should also be evident from the discussion above that the combination of a charge pump circuit, a filter circuit and a voltage controlled oscillator circuit may be considered to be a frequency multiplier. It has also been shown that any of the sub circuits may be modified in accordance with the invention to achieve "substantial" independent operation of the division ratio N.

In the discussion above, reference was made to a phase detector to compare $f_{ref}$ and $f_o$/N. It should be appreciated that any suitable phase detector and/or phase comparator could be used instead to practice the invention. Likewise, any suitable charge pump circuit, filter circuit or voltage controlled oscillator circuit could be used to practice the invention.

In the discussion of the invention, reference was made to the use of complementary metal oxide semiconductor devices. However, it should be understood that MOS semiconductor devices of either conductivity and/or bipolar transistors and/or any other suitable technology could be used to practice the invention.

What is claimed is:

1. A phase locked loop (PLL) comprising:
   a frequency multiplier circuit having first and second inputs and an output, said frequency multiplier circuit being responsive to the application to the first input of an input signal having a frequency, fref, for producing at said output an output signal, fo, having a frequency which is a function of the product of N and said frequency fref;
   a programmable frequency divider network programmable to divide by any number "N", where N is a number greater than 1, said divider network being connected between the output and the second input of the frequency multiplier so as to feed back to the second input a signal equal to fo/N;
   wherein the frequency multiplier circuit includes programmable circuitry, programmed to be a function of N, for selectively modifying the transfer function of the frequency multiplier as a function of the divider ratio N.

2. A PLL as claimed in claim 1 wherein the programmable circuitry is programmed to be a function of N for rendering the bandwidth of the PLL independent of the divider ratio N.

3. A PLL as claimed in claim 1 wherein the programmable divider network and the programmable circuitry are responsive to the same command signal controlling a change in the value of N.

4. A PLL as claimed in claim 1, wherein said frequency multiplier circuit includes a phase detector, a charge pump, a filter and a voltage controlled oscillator (VCO); and wherein said programmable circuitry is formed in at least one of the charge pump circuit, the filter circuit and the VCO circuit.

5. A PLL as claimed in claim 4, wherein the programmable circuitry is formed in the charge pump circuit and wherein the programmable circuitry includes a current multiplier with programmable current multiplying circuits whose current multiplying ratio is proportional to N.

6. A PLL as claimed in claim 4, wherein the programmable circuitry is formed in the filter circuit and wherein the circuitry includes a resistive network whose resistance is a programmable function of N.

7. A PLL circuit as claimed in claim 4, wherein the programmable circuitry is formed in the VCO and wherein the programmable circuitry includes current multiplying circuitry whose multiplying ratio is proportional to N.

8. A PLL as claimed in claim 4, wherein the circuitry is formed in the charge pump circuit, and wherein the circuitry includes programmable current divider network whose divide ratio is proportional to N.

9. A PLL as claimed in claim 3, wherein the programmable frequency divider network is responsive to a control signal for changing the value of N of the divider network and wherein the frequency divider network produces signals for controlling and changing the transfer function response of the frequency multiplier circuit in concurrence with the changing of the divider ratio value of the divider network.

10. A PLL as claimed in claim 3, wherein the programmable frequency divider network and the programmable circuitry within the frequency multiplier circuit are responsive to a common control command for concurrently changing the divider ration and the transfer function of the frequency multiplier when N is changed.

11. A PLL as claimed in claim 10, wherein the frequency multiplier circuit includes m inputs for selectively generating up to 2 to the m different values.

12. A PLL as claimed in claim 4 wherein the charge pump circuit produces a current at its output, which current is supplied to said filter for developing a control voltage, which control voltage is applied to said VCO for producing said fo signal at said output of the frequency multiplier; and wherein the phase detector has first and second inputs which define said first and second inputs of said frequency multiplier circuit and an output coupled to the charge pump for controlling the polarity of its output current.

13. A PLL as claimed in claim 12, wherein the control voltage is also fed back to an input of the charge pump circuit for controlling the amplitude of its output current.

14. A phase locked loop (PLL) comprising:
a programmable frequency multiplier circuit having an input port and an output port;
a programmable frequency divider network connected to the output port of the frequency multiplier;
control circuitry coupled to the programmable frequency divider and the programmable frequency multiplier for concurrently changing a division ratio of the divider and a transfer function of the frequency multiplier;
wherein an input signal having a frequency, $f_{ref}$, is applied to said input port and wherein the frequency multiplier produces an output signal, $f_o$, having a frequency equal to $(N)(f_{ref})$ at said output port and wherein the frequency divider network is programmable to divide by a selected number "N" and the divider network being connected between said output port and a second input port of the frequency multiplier circuit for feeding back to said second input port a signal equal to $f_o/N$; and
wherein the frequency multiplier circuit includes circuitry which is programmed to change its transfer function as a function of N for rendering the bandwidth of the PLL independent of the divider ratio N.

15. A PLL as claimed in claim 14 wherein the frequency divider ratio "N" and the frequency multiplier ratio are responsive to the same control signals.

16. A PLL as claimed in claim 14 wherein the frequency multiplier includes a phase detector having a first input adapted to receive said reference frequency ($f_{ref}$) signal and a second input adapted to receive said feed back signal $f_o/N$ and wherein the phase detector has an output coupled to the input of a charge pump for controlling a charge pump output current supplied to a filter circuit for developing a control voltage which is applied to a voltage controlled oscillator (VCO) for producing an output frequency signal ($f_o$), and wherein $f_o$ is applied to said programmable frequency divider network whose output is fed back to the second input of the phase detector.

17. A PLL as claimed in claim 16 wherein at least one of the charge pump circuit, the filter circuit and the VCO circuit, includes programmable circuitry which is programmable as a function of the divider ration "N" for rendering the bandwidth of the PLL independent of the divider ratio N.

18. A PLL as claimed in claim 17 wherein the programmable circuitry is formed in the charge pump circuit.

19. A PLL as claimed in claim 17 wherein the programmable circuitry is formed in the charge pump circuit and wherein the programmable circuitry includes programmable current multiplying circuits whose multiplying ratio is proportional to N.

20. A PLL as claimed in claim 17, wherein the programmable circuitry is formed in the filter circuit.

21. A PLL as claimed in claim 17, wherein the programmable circuitry is formed in the filter circuit and wherein the circuitry includes a resistive network whose resistance is a programmable function of N.

22. A PLL as claimed in claim 17, wherein the programmable circuitry is formed in the VCO.

23. A PLL as claimed in claim 17, wherein the programmable circuitry is formed in the VCO and wherein the circuitry includes current multiplying circuitry whose multiplying ratio is proportional to N.

24. A PLL as claimed in claim 17 wherein the programmable circuitry is formed in the charge pump circuit, and wherein the programmable circuitry includes programmable current divider circuits whose divide ratio is proportional to N.

25. A PLL as claimed in claim 17 wherein the programmable circuitry includes current multiplying circuits whose multiplying ratio is a programmable function of N.

26. A PLL as claimed in claim 17 wherein the programmable circuitry includes programmable current dividers programmable as a function of N.

27. In a PLL having a frequency multiplier with a divide-by-N network connected between an input and output of the frequency multiplier for producing an output frequency ($f_o$) equal to $(N)(f_{ref})$, where $f_{ref}$ is the frequency of a reference input signal applied to the input of the frequency multiplier and N is a divider ratio to which the divide-by-N network is selectively set, and wherein $f_{ref}$ and $f_o/N$ are supplied to the inputs of a phase detector whose output controls the polarity of conduction of a charge pump circuit having an output current which is supplied to a capacitive filter network, the improvement comprising:
programmable current amplifying circuitry within the charge pump circuit for producing an output current equal to $(N)(I_{ref})$, where $I_{ref}$ is a reference current in the charge pump circuit and N is equal to the divider ratio.

28. A charge pump circuit for a PLL having a frequency divider network with a division ratio equal to N, comprising:
a current mirror amplifier whose current multiplication ratio is settable to a value equal to the division ratio N of the divider network; and
a reference current ($I_{ref}$) supplied to said current mirror amplifier for producing an output current equal to $(N)(I_{ref})$.

29. In a phase locked loop (PLL) circuit responsive to a reference input signal (fref) for producing an output signal having a frequency ($f_o$) equal to (N)($f_{ref}$), where $f_{ref}$ is applied to an input of a phase detector and the $f_o$ signal is fed back via a programmable divide-by-N network to another input of the phase detector and wherein the output of the phase detector controls the output of a charge pump circuit which is supplied to a resistive-capacitive filter network for developing a control voltage applied to a voltage controlled oscillator (VCO) for producing the output signal ($f_o$), an improvement comprising:

a programmable network located in at least one of the charge pump circuit, the filter circuit and the VCO circuit, said programmable network being for rendering the circuit containing the programmable network a function of the divider ratio N, whereby the bandwidth of the PLL is increased and the jitter of $f_o$ is reduced.

30. In a phase locked loop (PLL) circuit responsive to a reference input signal ($f_{ref}$) for producing an output signal having a frequency ($f_o$) equal to (N)($f_{ref}$), where $f_o$ is applied to a divide-by-N network to produce $f_o$/N, and where $f_{ref}$ and $f_o$/N are applied to the inputs of a phase detector, and wherein the output of the phase detector controls a charge pump circuit whose output current is supplied to a capacitive-resistive (RC) filter network for developing a control voltage applied to a voltage controlled oscillator (VCO) for producing at the output of the VCO the output signal ($f_o$), an improvement comprising:

circuitry formed within a selected component of the PLL, other than the divide-by-N network, for rendering the selected component a function of N, whereby the bandwidth of the PLL is enhanced and the jitter of the PLL output is reduced.

31. A phase locked loop (PLL) system comprising:
a phase detector circuit having first and second inputs and an output;
circuitry for applying a reference signal (fref) to the first input of the phase detector;
a charge pump circuit having a control input coupled to the output of the phase detector for producing an output current supplied to an RC filter circuit for producing a control voltage;
a voltage controlled oscillator (VCO) circuit responsive to the control voltage for producing an output frequency signal (fo) equal to (N)(fref); where N is an integer greater than 1;
a programmable divide-by-N network connected to the output of the VCO for producing fo/N and for supplying fo/N to the second input of the phase detector; and
programmable circuitry formed in a selected circuit of the PLL, other than the divide-by-N network, for rendering the selected circuit a function of N and thereby enhancing the bandwidth of the PLL and reducing the jitter at the PLL output.

32. A PLL system as claimed in claim 31 wherein the programmable circuitry is formed in the charge pump circuit.

33. A PLL system as claimed in claim 31 wherein the programmable circuitry is formed in the charge pump circuit includes a programmable current multiplier.

34. A PLL system as claimed in claim 31 wherein the programmable circuitry is formed in the VCO.

35. A PLL system as claimed in claim 34 wherein the programmable circuitry in the VCO includes a programmable current multiplier.

36. A PLL system as claimed in claim 31 wherein the programmable circuitry is formed in the filter circuit.

37. A PLL as claimed in claim 36 wherein the programmable circuitry formed in the filter circuit includes selectively enabled switching transistors for controlling the value of the resistance of the filter circuit.

38. A PLL system as claimed in claim 31 wherein the PLL has a bandwidth which may be expressed as a function of the control voltage to frequency conversion of the VCO ($K_{vco}$), the output current (Ip) of the charge pump, the impedance of the filter network and the divider ratio "N"; and wherein one of $K_{vco}$, Ip and the impedance of the filter is made a function of N, in order to eliminate N as a factor in the bandwidth of the PLL.

39. A PLL as claimed in claim 31 wherein said VCO produces an output signal whose frequency ($f_o$) is equal to Kvco=$f_o/V_{CTL}$; and wherein Kvco is made to vary as a function of N; and $V_{CTL}$ is the control voltage applied to the VCO.

40. A PLL as claimed in claim 4 wherein the control voltage is a function of the output charge pump current and the impedance of the filter, and wherein the impedance of the filter is made to vary as a function of N.

41. A PLL as claimed in claim 40 wherein the impedance of the filter is a function of its resistance and its capacitance.

42. A PLL as claimed in claim 31 wherein the output current of the charge pump circuit is equal to a multiplying constant times a reference current and wherein the multiplying constant is made to vary as a function of N.

43. A phase locked loop (PLL) comprising:
a programmable frequency multiplier section having an input port and an output port;
a programmable divide-by-N network connected in a feedback loop between an output port and an input port of the frequency multiplier; and
said frequency multiplier section including programmable circuitry which is programmed to vary as a function of N for causing the bandwidth of the PLL to be substantially independent of the divider ratio "N".

44. A PLL as claimed in claim 43 wherein the programmable frequency multiplier includes a charge pump circuit, a filter circuit and a voltage controlled oscillator (VCO) circuit; and wherein the programmable circuitry is formed in one of these circuits to render the bandwidth of the PLL independent of the divider ratio, whereby the bandwidth is increased and the jitter at the PLL output is decreased.

45. A phase locked loop (PLL) comprising:
a frequency multiplier circuit having an input port and an output port, the frequency multiplier circuit being responsive to the application of an input signal having a frequency, fref, at its input port for producing at its output port an output signal, $f_o$, having a frequency equal to the product of N and $f_{ref}$, where N is an integer greater than one (1);
a programmable frequency divider network connected between the output port and input port of the frequency multiplier for feeding back a signal equal to $f_o$/N, said frequency divider network being selectively programmable to divide by a number "N"; and
the frequency multiplier circuit including programmable circuitry, programmed to be a function of N, for selectively modifying the transfer function of the frequency multiplier as a function of the divider ratio N.

46. A PLL as claimed in claim 45 wherein the programmable circuitry in the frequency multiplier circuit is programmed to be a function of N for rendering the bandwidth of the PLL substantially independent of the divider ratio "N".

47. A PLL as claimed in claim 46 wherein the programmable frequency divider network has a divider ratio which can be changed by a command signal and wherein the programmable frequency divider network and the programmable circuitry are responsive to the same command signal.

48. A phase locked loop (PLL) comprising:
- a frequency multiplier section and a programmable divide by N network connected across said frequency multiplier section; and
- said frequency mulitplier section including means responsive to the value of N for producing an inverse function of N so that the bandwidth of said PLL is substantially independent of the value of N.

49. A phase locked loop (PLL) comprising:
- a first circuit having an input port and an output port, said first circuit being responsive to the application at its input port of an input signal having a frequency, fref, for producing at said output an output signal, fo, having a frequency which is a function of the product of N and said frequency fref;
- a programmable frequency divider network programmable to divide by any number "N", where N is a number greater than 1, said divider network being connected between the output port and the input port of the first circuit so as to feed back to the input port a signal which is a function of fo/N; and
- wherein the first circuit includes programmable means which is a function of N, for selectively modifying the transfer function of the frequency multiplier as a function of the divider ratio N and for rendering the bandwidth of the PLL independent of the ratio N.

* * * * *